United States Patent

Ruppel et al.

[11] Patent Number: 6,064,269
[45] Date of Patent: May 16, 2000

[54] POWER AMPLIFIER WITH VARIABLE INPUT VOLTAGE SOURCE

[75] Inventors: John Stephen Ruppel, Keller; Dale Robert Anderson, Fort Worth, both of Tex.

[73] Assignee: Motorola, Inc., Schaumburg, Ill.

[21] Appl. No.: 09/126,873

[22] Filed: Jul. 31, 1998

[51] Int. Cl.[7] .................................................. H03F 3/04
[52] U.S. Cl. ................................... 330/297; 330/285
[58] Field of Search .............................. 330/297, 285, 330/298, 207 P

[56] References Cited

U.S. PATENT DOCUMENTS

| | | | |
|---|---|---|---|
| 3,478,275 | 11/1969 | Walker | 330/297 |
| 3,486,128 | 12/1969 | Lohrmann | 330/297 |
| 4,873,493 | 10/1989 | Fujiwara | 330/285 |

*Primary Examiner*—Robert Pascal
*Assistant Examiner*—Henry Choe
*Attorney, Agent, or Firm*—Mario J. Donato, Jr.

[57] ABSTRACT

A power amplifier circuit (10) utilizes a step-wise variable voltage source (22) to improve amplifier (14) operating efficiency. In one preferred embodiment, an input signal to the step-wise variable voltage source is obtained by observing an operating characteristic of the amplifier. In an alternate preferred embodiment of the present invention, a characteristic of the input signal driving the amplifier stage is used to form an input signal to the step-wise variable input voltage source.

15 Claims, 2 Drawing Sheets

POWER AMPLIFIER WITH VARIABLE INPUT VOLTAGE SOURCE

FIELD OF THE INVENTION

The present invention relates generally to power amplifiers, and particularly, to a power amplifier with a variable input voltage source.

BACKGROUND OF THE INVENTION

Cellular system operators are faced with a number of problems due to the presently inefficient power amplifier (PA) implementations. Cooling is the chief concern. The inefficient PA arrangements generate a tremendous amount of heat which must be dissipated to prevent damage to the PA and to associated circuitry. Because of the large amount of heat generated, the cellular base station has significant energy demands for operation of cooling equipment. Also, the inefficiencies of the devices themselves require that they too consume excess electrical energy. In some large base station implementations, the base station may actually present electrical requirements exceeding the local electrical supply.

The problem presents itself primarily as a result of the waveform being amplified. In an IS-95 based code division multiple access (CDMA) system, for example, the amplified waveform has a significant peak to average output deviation. A typical deviation is as much as 8 decibels (dB). To ensure that the signal is amplified without clipping or otherwise distorting the waveform, the amplifier is sized to accommodate the peak output requirements resulting in loss of efficiency.

One measure of the efficiency of the amplifier is the ratio of the average amplifier output power to the average direct current (DC) input power. In a typical CDMA arrangement, or similarly in a multi-tone arrangement, the amplifier is sized approximately 7–12 dB above the average output power to prevent clipping or other distortion of the amplified waveform. In addition, the amplifier will typically operate below the average output power level about 30% of the time, and will operate at peak output only a very small percentage, less than 5%, of the time. Thus, the efficiency of the power amplifier in a CDMA arrangement is very poor and typically only about 20%. In comparison, for an advanced mobile phone system (AMPS) base station with single carrier power amplifiers, a conventional class AB amplifier may be operated at a saturated efficiency as high as 50–60%.

To improve efficiency, one would ideally like to modulate the DC input voltage to follow the required amplifier output. However, providing a voltage modulator capable of operation at the bandwidth required for IS-95, 1.25 megaHertz (MHZ), and at even larger bandwidth for proposed next generation systems, presents significant difficulties. In addition, there is excessive delay associated with detecting the output RF waveform and using this information to form a voltage modulator input signal. Thus, even if a voltage modulator capable of operating at the required bandwidth was available, it has not been possible to effectively utilize the amplifier output to provide a feedback signal to the voltage modulator.

In commonly-assigned U.S. Pat. No. 5,239,275, Leitch et al. recognized that providing a step-wise varying DC input voltage can significantly improve amplifier efficiency. As taught by Leitch et al., a baseband, input signal is observed and utilized to form an input signal to a voltage modulator, actually a step-wise voltage generator which selects one of a number of DC voltage values. This overcomes the delay problems associated with detecting the RF waveform for generating a modulation signal. Unfortunately, a suitable baseband signal is not available in many system types. Similarly, in a multi-tone arrangement where a number of signals are combined at RF prior to amplification, a baseband representation of the signal to be amplified is likewise unavailable. And, in Fourier transform matrix systems, where a combined RF signal is split, amplified through a network of PAs and then recombined to produce an output signal, a suitable signal for use in performing voltage modulation is not available.

Thus, the problem of improving the efficiency of the RF power amplifier in cellular base stations, and particularly CDMA and other multi-tone systems, remains. Therefore a need exists for a power amplifier system with improved efficiency.

DETAILED DESCRIPTION OF THE PREFERRED EMBODIMENTS

A power amplifier circuit utilizes a step-wise variable input voltage source to improve amplifier operating efficiency. In one preferred embodiment, an input signal to the step-wise variable voltage source is obtained by observing an operating characteristic of the amplifier. In an alternate preferred embodiment of the present invention, a characteristic of the input RF signal driving the amplifier stage is used to form an input signal to the step-wise variable input voltage source.

Figure 1:
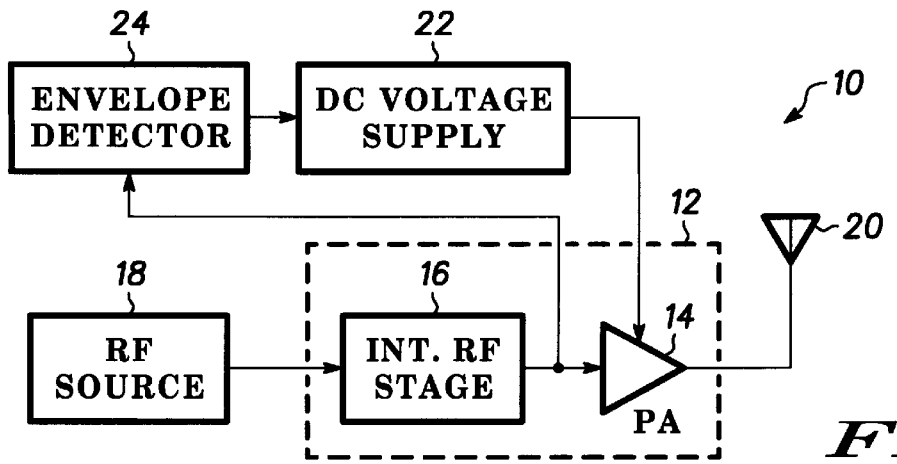
FIG. 1 is a block diagram of a power amplifier circuit in accordance with a preferred embodiment of the present invention.

Referring then to FIG. 1 of the drawings, a power amplifier circuit 10 includes a power amplifier stage 12 including a power amplifier stage (PA) 14 and an intermediate amplifier stage 16 and providing an amplified output signal. Power amplifier stage 12 is coupled to a radio frequency signal source 18, such as generated within a base station of a cellular communication systems and as is very well known in the art. Power amplifier stage 12 amplifies the radio frequency signals and produces the amplified output signal for transmission from antenna 20 coupled to an output of power amplifier stage 12. PA 14 may be a class AB amplifier, but it be appreciated that the present invention may be used with virtually any class amplifier.

Power amplifier circuit 10 further includes a step-wise variable DC voltage source 22 having an output coupled to a direct current voltage input of PA 14. Voltage source 22 provides a step-wise variable voltage to PA 14 approximating an ideal voltage curve. Ideal voltage curve is used to refer to the case where the DC input voltage is directly proportional to the output power of PA 14. More specifically, the ideal case is accomplished where the DC input voltage is such that PA 14 is maintained just out of saturation. A possible construction for voltage source 22 includes a number of voltage sources corresponding in number an in output to the number and magnitude of voltage steps and selectively switchable to provide a supply DC voltage to PA 14. An alternative implementation may be a single voltage source coupled through a switchable voltage ladder to PA 14.

Figure 2:
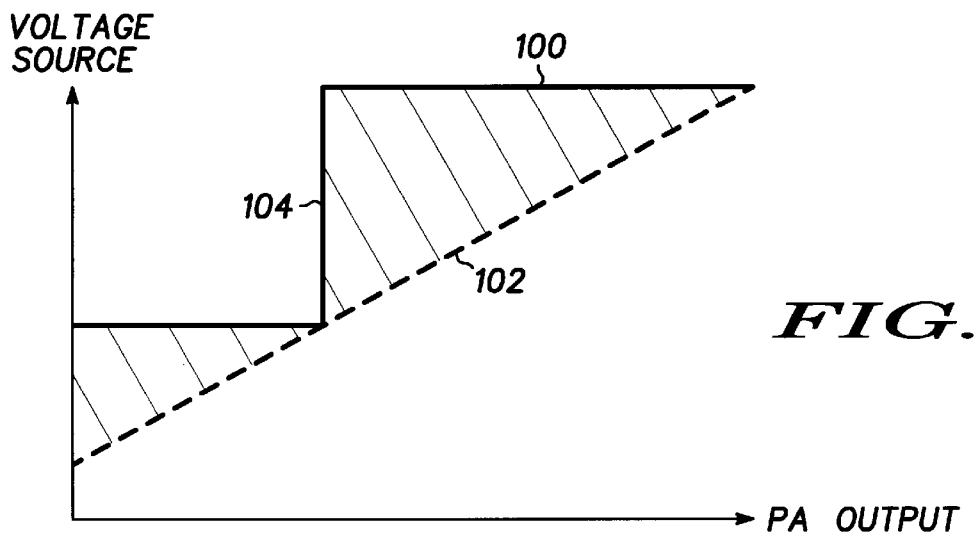
FIG. 2 is a chart illustrating an amplifier voltage input signal generated in accordance with a preferred embodiment of the present invention.

With reference to FIG. 2, a two-step voltage curve 100 is illustrated adjacent an ideal voltage curve 102. The area, shown shaded, between voltage curve 100 and the ideal curve 102 represents the loss of efficiency over the ideal case. The voltage step 104 in voltage curve 100 may be evenly spaced, or more preferably, is adjusted to be optimized for a particular waveform type based upon a cumulative distribution function (CDF) for the waveform. For example, in a CDMA system where the output is actually below average approximately 65% of the time, voltage step 104 may be biased accordingly, i.e., to minimize the area under voltage curve 100 below 65% PA output, to obtain a maximum efficiency.

Figure 3:
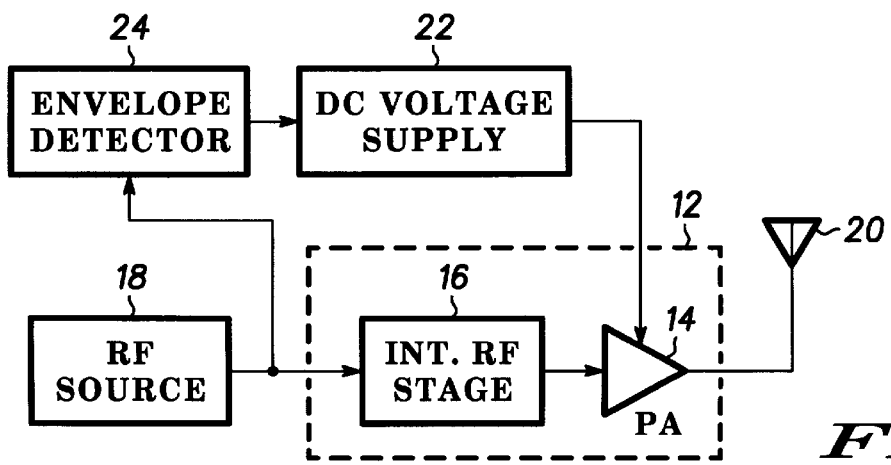
FIG. 3 is a block diagram of a power amplifier circuit in accordance with an alternate preferred embodiment of the present invention.

Referring once again to FIG. 1, an envelope detector 24 provides an input signal to voltage source 22. Envelope detector 24 includes an input coupled to the input of PA 14 to observe the input RF waveform and to provide a voltage control signal to voltage source 22 representative of the waveform envelope. The input RF waveform to PA 14 provides a reliable, and accessible in most systems, indication of PA 14 output. Referring to FIG. 3, with like elements represented by like reference numerals, envelope detector 24 may alternative take as its input the input RF waveform to power amplifier stage 12. It is important to note that the input voltage source 22 be representative of the RF waveform envelope. Thus, it is possible to sample the waveform at the input to PA 14, at the input to power amplifier stage 12 or virtually anywhere along the signal path where a reliable, accurate representation of the waveform may be obtained.

Figure 4:
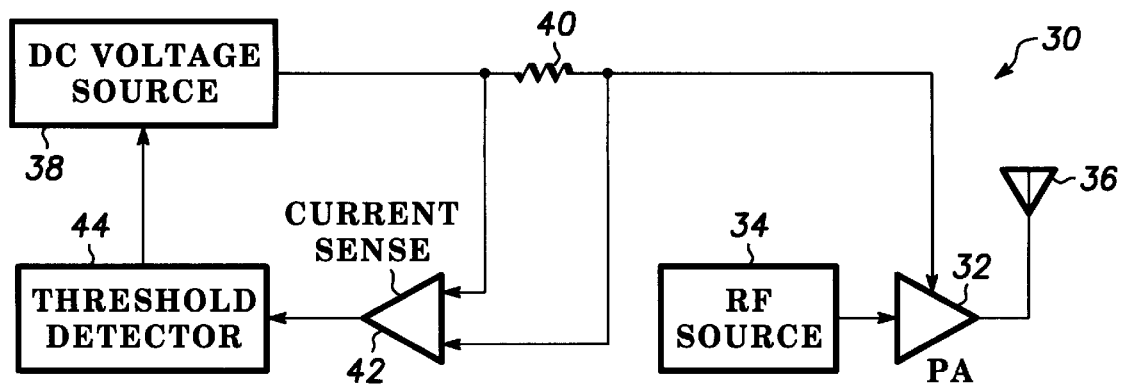
FIG. 4 is a block diagram of a power amplifier in accordance with still another alternate preferred embodiment of the present invention.

Referring now to FIG. 4, an amplifier circuit 30 in accordance with an alternate preferred embodiment of the present invention includes a power amplifier (PA) 32 having an output coupled to an antenna 36 and having an RF input coupled to an RF source 34. PA 32 further includes a DC voltage input coupled via a current sense resistor 40 to a step-wise variable DC voltage source 38.

A current sense circuit 42, shown for example as a comparator, has two inputs coupled to an input and an output, respectively, of current sense resistor 40. Circuit 42 provides a signal indicative of the current draw of PA 32. The current drawn by PA 32, or load current, is indicative of an operating characteristic and particularly the output of PA 32. The load current may thus be used to form a voltage control signal to voltage source 38. In this regard, an output of circuit 42 is coupled to a threshold detector 44 which, based upon the sensed load current, provides a switching signal to voltage source 38 causing it to switch between one of a plurality of supply voltage levels.

Figure 5:
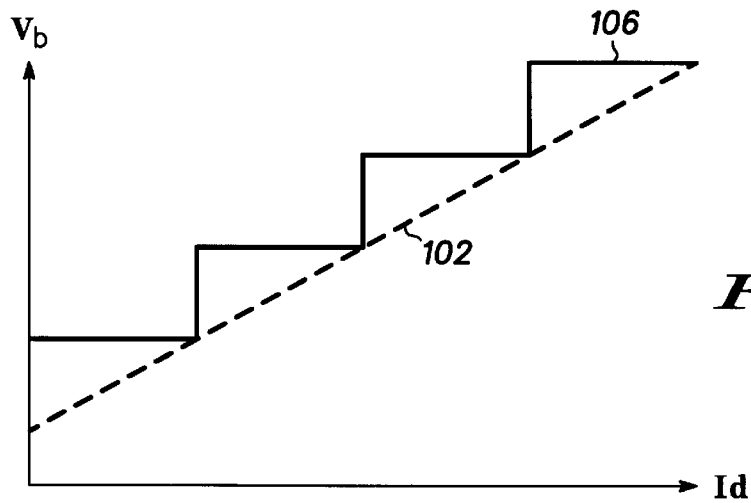
FIG. 5 is a chart illustrating an amplifier voltage input signal generated in accordance with an alternate preferred embodiment of the present invention.

In FIG. 2, a possible two-step voltage curve 100 was shown in association with voltage source 22. A similar voltage curve may be provided by voltage source 38. Additional voltage steps provide a closer approximation to the ideal curve 102. Thus, in alternate preferred embodiments each of voltage source 22 and voltage source 38 may provide a plurality of voltage steps. For example, and as illustrated in FIG. 5, a four-step voltage curve 106 is shown. As before, the voltage steps may be evenly spaced or may be optimized based upon the RF waveform. In fact, a four step voltage curve provides marked improvement in efficiency showing only between about 10–15% degradation from ideal. Thus, additional voltage steps may add unnecessarily to the complexity of the power amplifier circuit. Most preferably the voltage source is arranged to provide two to four voltage steps.

Figure 6:
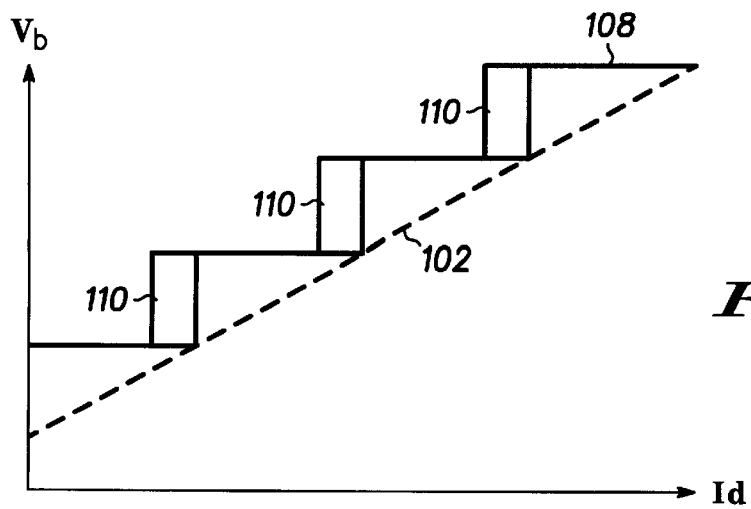
FIG. 6 is a chart illustrating an amplifier voltage input signal generated in accordance with still another alternate preferred embodiment of the present invention.

It is anticipated that field effect transistor (FET) type amplifier circuits will behave in a relatively stable manner with respect to the step-wise changes in input voltage. It will be appreciated that the amplifier circuit be relatively insensitive to supply voltage changes. Stability may be further enhanced by providing hysterisis in the voltage curve. FIG. 6 illustrates a four step supply voltage curve 108 incorporating hysterisis 110. If hysterisis 110 is used, it may be advantageously incorporated directly into voltage source 22 or voltage source 38, or may be incorporated into threshold detector 44 or current sense circuit 42.

Many changes and modifications could be made to the invention without departing from the fair scope and spirit thereof. The scope of some changes is discussed above. The scope of others will become apparent from the appended claims.

We claim:

1. A power amplifier circuit comprising:
   an amplifier arranged to receive an input signal and to provide an amplified output signal, the amplifier including a direct current voltage input, the direct current voltage input being coupled to a direct current voltage source;
   a detector coupled to the input signal, the detector providing a characteristic of the input signal, the amplifier comprising a power amplifier stage and an intermediate amplifier stage, the detector coupled to an input of the intermediate amplifier stage; and
   the direct current voltage source responsive to the characteristic for providing a step-wise variable voltage to the amplifier.

2. The power amplifier circuit of claim 1, the detector comprising an envelope detector.

3. The power amplifier circuit of claim 1, the input signal comprising an radio frequency signal.

4. The power amplifier circuit of claim 1, wherein the detector is coupled to an input of the power amplifier stage.

5. The power amplifier circuit of claim 1, the detector comprising a current sense circuit.

6. The power amplifier circuit of claim 5, the current sense circuit arranged to detect a load current of the amplifier.

7. The power amplifier circuit of claim 1, the step-wise variable voltage comprising two to four voltage steps.

8. The power amplifier circuit of claim 1, the step-wise variable voltage comprising four voltage steps.

9. The power amplifier circuit of claim 1, the step-wise variable voltage comprising two to four evenly spaced voltage steps.

10. The power amplifier circuit of claim 1, the step-wise varying direct current voltage comprising two to four offset voltage steps.

11. The power amplifier circuit of claim 10, the offset voltage steps arranged to maximize efficiency for an radio frequency signal.

12. The power amplifier circuit of claim 1, the step-wise variable voltage including hysterisis.

13. A power amplifier circuit comprising:

a power amplifier circuit comprising a power amplifier stage and an intermediate amplifier stage and including a radio frequency signal input, an amplified signal output and a direct current voltage input;

a signal characteristic detector coupled to an input of the intermediate amplifier stage, the signal characteristic detector adapted to detect a characteristic of the radio frequency signal input and to produce a voltage control signal; and a step-wise variable voltage source responsive to the voltage control signal for providing a step-wise variable voltage to the direct current voltage input.

14. The power amplifier circuit of claim 13, wherein the signal characteristic detector comprises an envelope detector.

15. The power amplifier circuit of claim 14, the step-wise variable voltage is arranged to maximize efficiency of the power amplifier for a radio frequency signal.

* * * * *